(12) United States Patent
Nakanishi et al.

(10) Patent No.: US 11,372,256 B2
(45) Date of Patent: Jun. 28, 2022

(54) OPTICAL ELEMENT

(71) Applicant: HAMAMATSU PHOTONICS K.K., Hamamatsu (JP)

(72) Inventors: Atsushi Nakanishi, Hamamatsu (JP); Hironori Takahashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/781,135

(22) Filed: Feb. 4, 2020

(65) Prior Publication Data
US 2020/0249488 A1  Aug. 6, 2020

(30) Foreign Application Priority Data
Feb. 6, 2019  (JP) .............. JP2019-019735

(51) Int. Cl.
G02B 27/12 (2006.01)
G02B 27/10 (2006.01)
H01S 5/34 (2006.01)
G02F 1/355 (2006.01)

(52) U.S. Cl.
CPC ....... G02B 27/126 (2013.01); G02B 27/1006 (2013.01); *G02F 1/3551* (2013.01); *G02F 2202/20* (2013.01); *G02F 2203/13* (2013.01); *H01S 5/3402* (2013.01)

(58) Field of Classification Search
CPC . G02B 27/1006; G02B 27/126; G02F 1/3551; G02F 1/3555
See application file for complete search history.

(56) References Cited

U.S. PATENT DOCUMENTS

| | | | | |
|---|---|---|---|---|
| 3,704,934 A | * | 12/1972 | Holmes | G02B 27/283 |
| | | | | 359/489.08 |
| 5,243,465 A | * | 9/1993 | Fein | G01J 3/02 |
| | | | | 359/350 |
| 7,796,340 B2 | * | 9/2010 | Bloch | G02B 27/0905 |
| | | | | 359/640 |
| 9,638,846 B2 | * | 5/2017 | Parsons | G01J 3/36 |

(Continued)

OTHER PUBLICATIONS

Court, Ian N. et al., "Frustrated Total Internal Reflection and Application of Its Principle to Laser Cavity Design," Applied Optics 6, 1964,vol. 3, No. 6, pp. 719-726.

(Continued)

*Primary Examiner* — Alicia M Harrington
(74) *Attorney, Agent, or Firm* — Faegre Drinker Biddle & Reath LLP

(57) ABSTRACT

Provided is an optical element including: a main body which is formed of a medium capable of transmitting first light and second light having a wavelength longer than that of the first light, in which the main body includes an incident region into which the first light and the second light are incident, in which a gap which is inclined with respect to the incident region and in which a medium having a refractive index with respect to the first light and the second light lower than that of the main body is disposed is provided inside the main body, and in which a gap width from an interface bordering the main body and the gap is larger than a penetration length of an evanescent wave of the first light at the interface and is smaller than a penetration length of an evanescent wave of the second light at the interface.

16 Claims, 15 Drawing Sheets

(56) References Cited

U.S. PATENT DOCUMENTS

2013/0308198 A1* 11/2013 Erdogan .............. G02B 27/142
                                                        359/640
2019/0011714 A1* 1/2019 Hendrix ............... G02B 27/126

OTHER PUBLICATIONS

Harrick, N. J. et al., "Internal Reflection Spectroscopy," 3rd printing (Harrick Scientific Corp., New York), 1987, pp. 36-39.

* cited by examiner

OPTICAL ELEMENT

TECHNICAL FIELD

The present disclosure relates to an optical element.

BACKGROUND

As a conventional optical element, there is known an optical element described in, for example, Non Patent Literature 1 (Ian N. Court and Frederic K. von Willisen, "Frustrated Total Internal Reflection and Application of Its Principle to Laser Cavity Design", Applied Optics 6, 719 (1964)) and Non Patent Literature 2 (N. J. Harrick, Internal Reflection Spectroscopy, 3rd printing (Harrick Scientific Corp., New York, 1987)), p. 37. The optical element includes a gap in a medium through which light of a single wavelength is transmitted. The light which is incident to the optical element is demultiplexed into light which is totally reflected by an interface bordering the medium and the gap and light passing through the gap via an evanescent wave generated at the interface. The light separation ratio is variable by adjusting the gap interval.

SUMMARY

For example, in a difference frequency generation terahertz quantum cascade laser (THzDFG-QCL) that generates a terahertz wave, a broadband terahertz wave and mid-infrared light having a wavelength of about 10 μm are output coaxially or substantially coaxially. It is thought that such a laser device is applied to, for example, spectroscopic measurement or the like using the terahertz wave. In the conventional spectroscopic measurement using the terahertz wave, a method of only using the terahertz wave by cutting the mid-infrared light has been examined. However, when the terahertz wave and the mid-infrared light are used in combination, it is expected that the application range of spectroscopic measurement is further expanded.

In order to realize such a technique, an optical element capable of demultiplexing/multiplexing lights of different wavelengths with high efficiency is required. However, since the optical elements described in Non Patent Literatures 1 and 2 above are used to demultiplex light of a single wavelength, the demultiplexing/multiplexing of the lights of different wavelengths is not considered. Further, it is thought that deterioration and damage occur for high output light in the optical element using the dielectric multilayer film.

The present disclosure has been made to solve the above-described problems and an object thereof is to provide an optical element capable of demultiplexing/multiplexing lights of different wavelengths with high efficiency.

An optical element according to an aspect of the present disclosure includes: a main body which is formed of a medium capable of transmitting first light and second light having a wavelength longer than that of the first light, in which the main body includes an incident region into which the first light and the second light are incident, in which a gap which is inclined with respect to the incident region and in which a medium having a refractive index with respect to the first light and the second light lower than that of the main body is disposed is provided inside the main body, and in which a gap width from an interface bordering the main body and the gap is larger than a penetration length of an evanescent wave of the first light at the interface and is smaller than a penetration length of an evanescent wave of the second light at the interface.

In the optical element, the gap width is larger than the penetration length of the evanescent wave of the first light at the interface. For this reason, the first light incident to the main body is emitted from the main body after being totally reflected from the interface without substantially passing through the gap. Meanwhile, in the optical element, the gap width is smaller than the penetration length of the evanescent wave of the second light at the interface. For this reason, the second light incident to the main body passes through the gap via the evanescent wave and is emitted from the main body. Thus, in the optical element, it is possible to demultiplex/multiplex the lights of different wavelengths at the interface bordering the main body and the gap with high efficiency.

The main body may include a first portion including an incident region into which the first light and the second light are coaxially incident and an emission region which emits the first light reflected by the interface and a second portion including an emission region which emits the second light passing through the gap. In this case, the optical element demultiplexing the lights of different wavelengths with high efficiency can have a simple configuration.

The main body may include a first portion including an incident region into which the second light is incident and a second portion including an incident region into which the first light is incident and an emission region which coaxially emits the first light reflected by the interface and the second light passing through the gap. In this case, the optical element multiplexing the lights of different wavelengths with high efficiency can have a simple configuration.

The main body may include a spacer which forms the gap. In this case, the gap with a desired gap width can be easily formed by the spacer.

The spacer may be formed by a convex portion which is provided in at least one of the first portion and the second portion. Accordingly, the spacer can have a simple configuration.

The spacer may be formed by a frame member that is sandwiched by the first portion and the second portion. Accordingly, the spacer can have a simple configuration.

The spacer may be forming by at least one of a fiber, a particle, and a columnar member sandwiched by the first portion and the second portion. Accordingly, the spacer can have a simple configuration.

The spacer may be formed by a liquid and the first portion and the second portion may be coupled to each other through the liquid. In this case, the configuration of the spacer and the coupling of the first portion and the second portion in the main body can be realized by the liquid at the same time. Further, the gap can be uniformly filled with the liquid.

The main body may have a spherical shape. In this case, the variability of the incident angles of the first light and the second light can be increased. Further, it is easy to maintain an angle difference between the incident angle and the emission angle when the incident angle is variable.

The main body may further include a coupler which adjusts incident angles or emission angles of the first light and the second light. In this case, it is possible to increase the variability of the incident angles or the emission angles of the first light and the second light.

A wavelength of the second light may be seven times or more a wavelength of the first light. In this case, the first light and the second light can be demultiplexed/multiplexed with more sufficient efficiency.

DETAILED DESCRIPTION

Hereinafter, preferred embodiments of an optical element according to an aspect of the present disclosure will be described in detail with reference to the drawings.

[Configuration of Optical Element]

Figure 1:
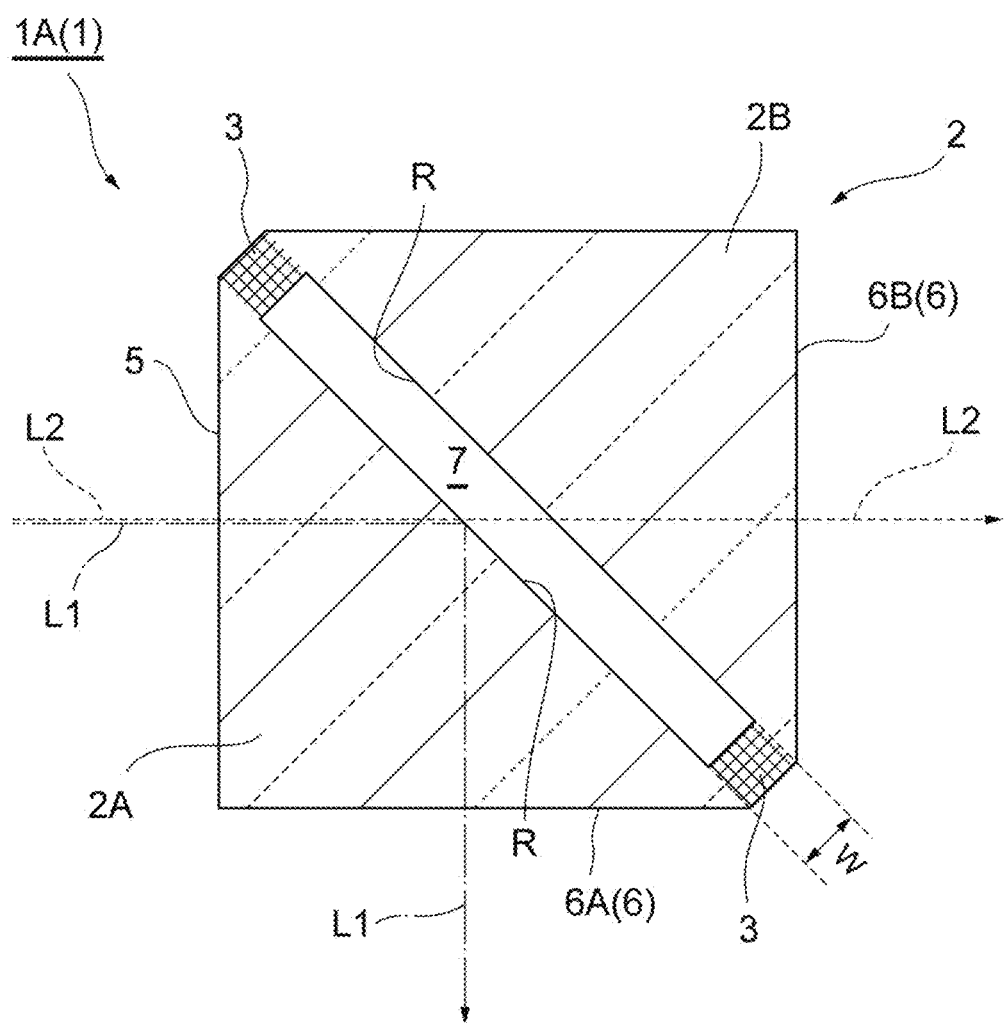
FIG. 1 is a schematic cross-sectional view illustrating an example of a configuration of an optical element which is a demultiplexing element.

FIG. 1 is a schematic cross-sectional view illustrating an example of a configuration of an optical element which is a demultiplexing element. As illustrated in the same drawing, an optical element 1 is configured as a demultiplexing element 1A which demultiplexes first light L1 and second light L2 having a wavelength longer than that of the first light L1. The first light L1 and the second light L2 to be demultiplexed/multiplexed are not particularly limited and can be applied to various combinations such as mid-infrared light and terahertz wave, visible light and terahertz wave, visible light and infrared light, and ultraviolet light and mid-infrared light. Here, as the first light L1 and the second light L2, two lights output from a difference frequency generation terahertz quantum cascade laser (THzDFG-QCL) coaxially or substantially coaxially are exemplified (the coaxial state is illustrated). In this case, the first light L1 is mid-infrared light having a wavelength of about 10 μm and the second light L2 is a terahertz wave having a wavelength of about 100 μm.

The optical element 1 includes a main body 2 which is formed of a medium capable of transmitting the first light L1 and the second light L2. As the medium forming the main body 2, for example, high resistance silicon, germanium, magnesium oxide, quartz, sapphire, cycloolefin polymer, and the like are exemplified. The main body 2 includes a first portion 2A, a second portion 2B, and a spacer 3 and is formed in a substantially cubic shape of about several tens of mm by combining these.

The first portion 2A is one triangular prism-shaped portion which bisects the main body 2 and the second portion 2B is the other triangular prism-shaped portion which bisects the main body 2. One of the rectangular side surfaces of the first portion 2A becomes an incident region 5 into which the first light L1 and the second light L2 are incident substantially coaxially. The other of the rectangular side surface of the first portion 2A becomes a first emission region 6A from which the first light L1 is emitted. In the second portion 2B, the rectangular side surface facing the incident region 5 becomes a second emission region 6B from which the second light L2 is emitted. In the example illustrated in FIG. 1, the incident angles of the first light L1 and the second light L2 with respect to the incident region 5 are 90°.

A gap 7 which is inclined with respect to the incident region 5 is provided inside the main body 2. In the example illustrated in FIG. 1, the inclination angle of the gap 7 with respect to the incident region 5 is 45°. A medium having a refractive index with respect to the first light L1 and the second light L2 lower than that of the main body 2 is disposed in the gap 7. As the medium disposed inside the gap 7, for example, air, polytetrafluoroethylene, glass, crystal, sapphire, paraxylylene, tetraethoxysilane (TEOS), and the like are exemplified. Since glass is a medium having low permeability with respect to terahertz waves but having a very short propagation distance in the gap 7, glass can be used as a medium disposed inside the gap 7.

Figure 2:
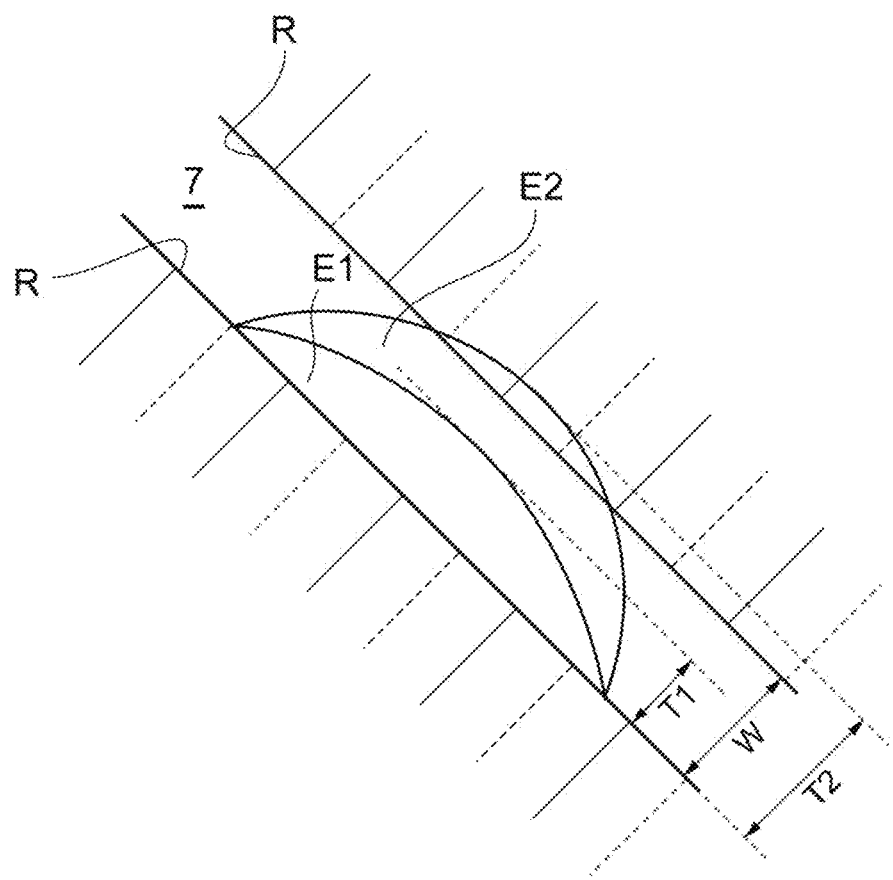
FIG. 2 is a main enlarged cross-sectional view illustrating a gap.

An interface R bordering the main body 2 and the gap 7 includes an inclined surface of the first portion 2A and an inclined surface of the second portion 2B. All of the inclined surface of the first portion 2A and the inclined surface of the second portion 2B are inclined with respect to the side surface corresponding to the incident region 5 in the first portion 2A. Further, the inclined surface of the first portion 2A and the inclined surface of the second portion 2B are parallel or substantially parallel to each other. Accordingly, the gap 7 is inclined with respect to the incident region 5. As illustrated in FIG. 2, the gap width (the width in the direction of the perpendicular line connecting two interfaces R and R) W from the interface R is larger than a penetration length T1 of an evanescent wave E1 of the first light L1 at the interface R and is smaller than a penetration length T2 of an evanescent wave E2 of the second light L2 at the interface R.

Figure 4A:
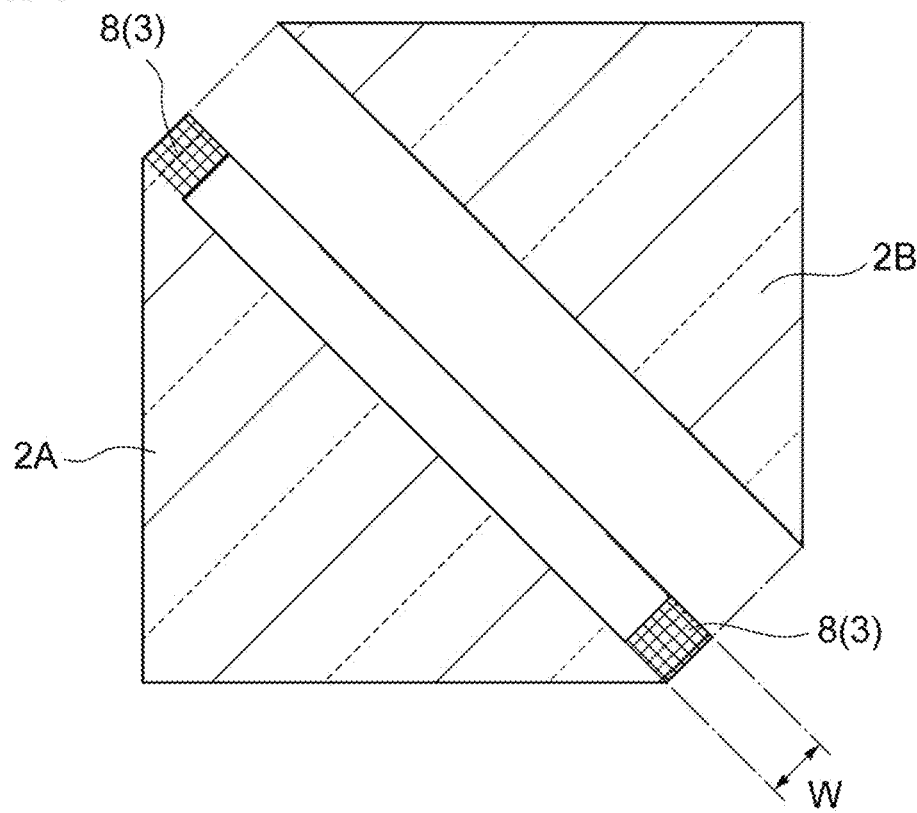
FIG. 4A is a schematic cross-sectional view illustrating an example of an optical element manufacturing method.

The gap width W is maintained by the spacer 3. In the example illustrated in FIG. 1, the spacer 3 is formed by a frame-shaped convex portion 8 (see FIG. 4A) provided in the main body 2 itself. The height of the convex portion 8 from the interface R matches the gap width W, so that the desired gap width W is maintained. When the medium disposed inside the gap 7 is a solid and has a sheet shape with a uniform thickness, it is possible to suppress the deviation of the gap width W from the design value due to the distortion of the main body 2 according to stress, the manufacturing error, or the like.

Generally, the penetration length of the evanescent wave on the total reflection surface increases in proportion to the wavelength of the incident light. When the gap width W satisfies the above-described condition, the first light L1 incident from the incident region 5 is totally reflected by the interface R on the side of the incident region 5 and is emitted from the first emission region 6A as illustrated in FIG. 1. Meanwhile, the second light L2 which is incident from the incident region 5 coaxially or substantially coaxially with the first light L1 passes through the gap 7 via the evanescent wave E2 and is emitted from the second emission region 6B.

Thus, in the demultiplexing element 1A, the first light L1 and the second light L2 of different wavelengths can be demultiplexed with high efficiency at the interface R bordering the main body 2 and the gap 7. In the demultiplexing element 1A, the first light L1 which is mid-infrared light is totally reflected at the interface R and enters the gap 7 to some extent. For this reason, it is possible to avoid deterioration of the main body 2 due to the heat of mid-infrared light or the like. Further, since the structure is simple compared to a dielectric multilayer film or the like, the manufacturing cost can be greatly suppressed.

Figure 3:
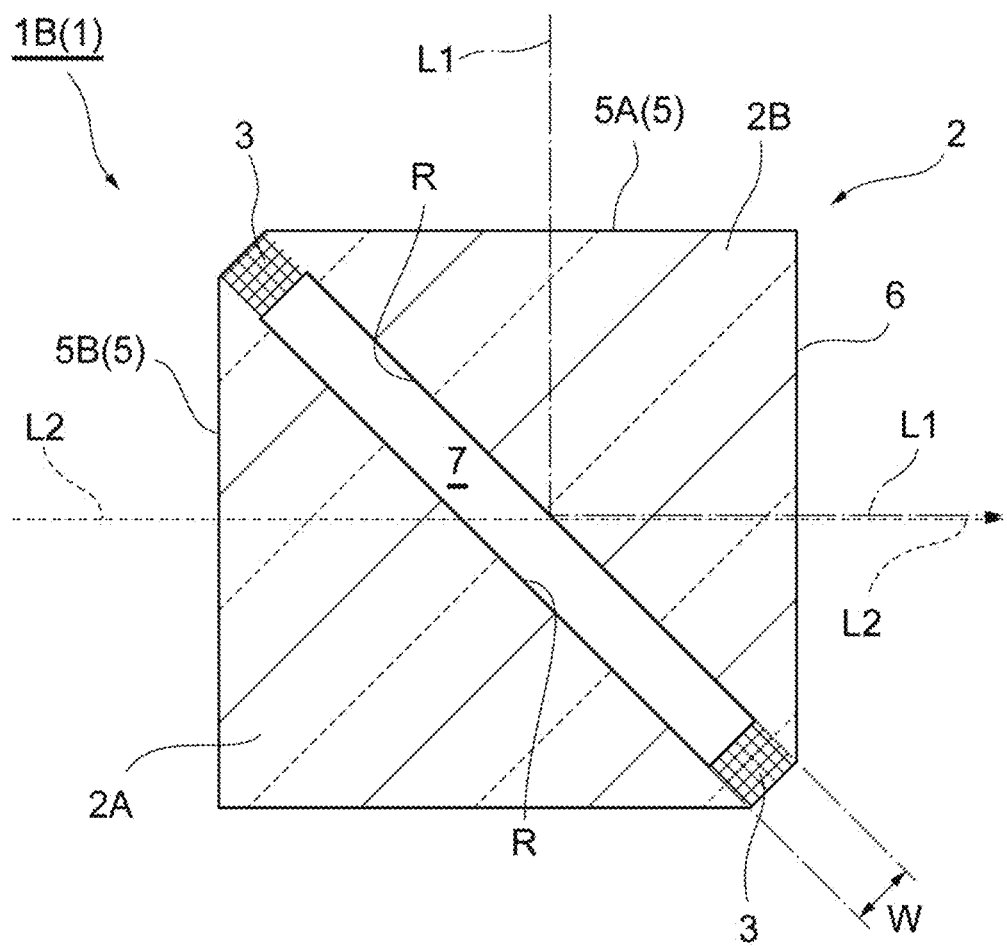
FIG. 3 is a schematic cross-sectional view illustrating an example of a configuration of an optical element which is a multiplexing element.

FIG. 3 is a schematic cross-sectional view illustrating an example of a configuration of an optical element which is a multiplexing element. As illustrated in the same drawing, the optical element 1 is configured as a multiplexing element 1B which multiplexes the first light L1 and the second light L2 having a wavelength longer than that of the first light L1. In the multiplexing element 1B, one of the rectangular side surfaces of the first portion 2A becomes a second incident region 5B into which the second light L2 is incident. Further, in the second portion 2B, the rectangular side surface orthogonal to the second incident region 5B becomes a first incident region 5A into which the first light L1 is incident and the rectangular side surface facing the second incident region 5B becomes an emission region 6 from which the first light L1 and the second light L2 are emitted coaxially or substantially coaxially. In the example illustrated in FIG. 3, all of the incident angle of the first light L1 with respect to the first incident region 5A and the incident angle of the second light L2 with respect to the second incident region 5B are 90°.

In the multiplexing element 1B, since the gap width W satisfies the above-described condition, the first light L1 incident from the first incident region 5A is totally reflected at the interface R on the side of the first incident region 5A and is emitted from the emission region 6. Meanwhile, the second light L2 which is incident from the second incident region 5B passes through the gap 7 via the evanescent wave E2 and is emitted from the emission region 6 coaxially or substantially coaxially with the first light L1. Thus, in the multiplexing element 1B, it is possible multiplex the first light L1 and the second light L2 having different wavelengths with high efficiency at the interface R bordering the main body 2 and the gap 7.

In the optical element 1, the transmittance of the first light L1 and the second light L2 at the interface R can be changed by the gap width W, the inclination angle, and the refractive index of the medium disposed in the gap 7. When the refractive index of the medium forming the main body 2 is n0 and the refractive index of the medium disposed in the gap 7 is n1, the transmittances Tp and Ts of the incident light at the interface R can be obtained by using the following equations (1) and (2). Tp is the transmittance of p-polarized light and Ts is the transmittance of s-polarized light.

[Math. 1]

$$Tp = 1/(\alpha p \cdot \sinh^2 y + 1) \qquad (1)$$

[Math. 2]

$$Ts = 1/(\alpha s \cdot \sinh^2 y + 1) \qquad (2)$$

y, $\alpha p$, and $\alpha s$ in the above-described equations (1) and (2) are expressed by the following equations (3) to (5). d is the gap width, $\phi 0$ is the incident angle of the light with respect to the interface R, N is the ratio (=n0/n1) of n0 with respect to n1, and $\lambda$ is the wavelength.

[Math. 3]

$$y = 2\pi \cdot n1 \cdot d(\sqrt{N^2 \sin^2 \phi 0 - 1})/\lambda \qquad (3)$$

[Math. 4]

$$\alpha p = \frac{1}{4}(N^2 - 1)^2 \cdot \alpha s \qquad (4)$$

[Math. 5]

$$\alpha s = ((N^2 - 1)/N)^2 \cdot (1/(N^2 - 2)) \qquad (5)$$

In the manufacturing of the optical element 1, the first portion 2A and the second portion 2B are first prepared. In the example illustrated in FIG. 4A, the convex portion 8 having a frame shape is provided in the edge portion of the inclined surface of the first portion 2A by cutting or etching. Then, the first portion 2A and the second portion 2B are coupled so as to align the inclined surface of the second portion 2B with the convex portion 8 of the inclined surface of the first portion 2A, so that the optical element 1 can be simply obtained. Further, the gap 7 with the desired gap width W can be easily formed by the convex portion 8 provided in the first portion 2A.

Figure 4B:
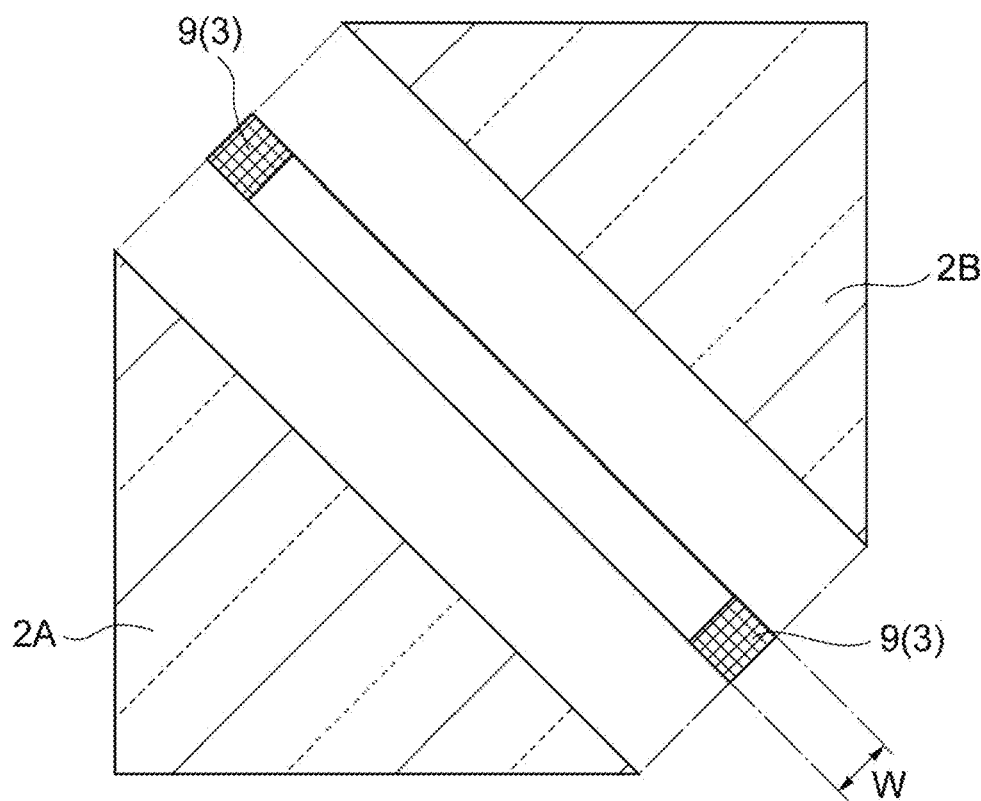
FIG. 4B is a schematic cross-sectional view illustrating an example of the optical element manufacturing method.

For the coupling of the first portion 2A and the second portion 2B, an adhesive may be used or a non-adhesive technique such as room temperature bonding may be used. In the example illustrated in FIG. 4A, the convex portion 8 is provided on the side of the first portion 2A, but the convex portion may be provided on the side of the second portion 2B or the convex portion may be provided in both of the first portion 2A and the second portion 2B. Further, as illustrated in FIG. 4B, a frame member 9 formed by the same medium as that of the main body 2 may be the spacer 3 and the first portion 2A and the second portion 2B may be coupled to each other so as to sandwich the frame member 9. In order to maintain the coupling state between the first portion 2A and the second portion 2B, a fixing jig or the like may be provided outside the main body 2.

[Application Example of Optical Element]

Figure 5:
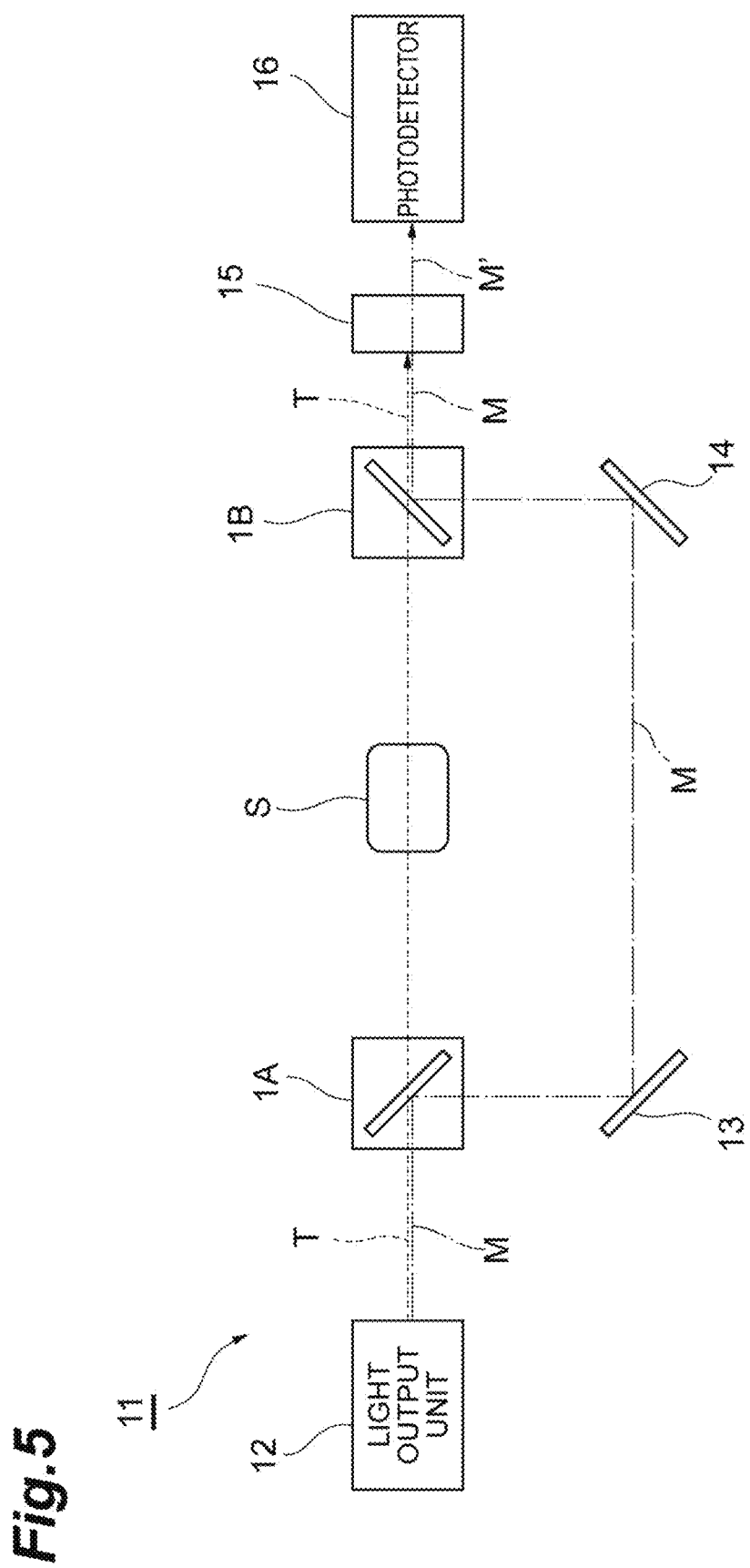
FIG. 5 is a schematic diagram illustrating a configuration example of a spectroscopic measurement device which employs the optical element.

FIG. 5 is a schematic diagram illustrating a configuration example of a spectroscopic measurement device which employs the optical element. A spectroscopic measurement device 11 illustrated in FIG. 5 is a device which acquires information on a measurement object S by using a terahertz wave T. As the information on the measurement object 5, for example, optical constants such as absorption coefficient and refractive index are exemplified. The spectroscopic measurement device 11 includes a light output unit 12, the demultiplexing element 1A, the multiplexing element 1B, mirrors 13 and 14, a wavelength conversion element 15, and a photodetector 16.

The light output unit 12 is, for example, a difference frequency generation terahertz quantum cascade laser (THzDFG-QCL) and coaxially or substantially coaxially outputs the terahertz wave T and the mid-infrared light M. The terahertz wave T and the mid-infrared light M output from the light output unit 12 are demultiplexed by the demultiplexing element 1A. The terahertz wave T passes through the demultiplexing element 1A and acts on the measurement object S (here, passes through the measurement object S). The terahertz wave T acting on the measurement object S passes through the multiplexing element 1B and is incident to the photodetector 16 through the wavelength conversion element 15. The mid-infrared light M is reflected by the demultiplexing element 1A and is branched from the terahertz wave T. The mid-infrared light M which is branched from the terahertz wave T is guided by the mirrors 13 and 14 and is incident to the multiplexing element 1B by an optical path different from that of the terahertz wave T. The mid-infrared light M is multiplexed with the terahertz wave T in the multiplexing element 1B and is incident to the photodetector 16 through the wavelength conversion element 15.

The wavelength conversion element 15 is configured as, for example, a nonlinear optical crystal such as lithium niobate ($LiNbO_3$). Further, the photodetector 16 is configured as, for example, a semiconductor detector having sufficient sensitivity with respect to the light of the wavelength subjected to the wavelength conversion to be described later. When the terahertz wave T and the mid-infrared light M are incident to the wavelength conversion element 15 at the same time, light M' of a wavelength different from those of the terahertz wave T and the mid-infrared light M is generated due to a non-linear optical effect. The light M' generated in the wavelength conversion element 15 is detected by the photodetector 16.

The light intensity of the light M' generated by the wavelength conversion element 15 is dependent on the electric field strength of the terahertz wave T. Thus, it is possible to indirectly detect the strength of the terahertz wave T by detecting the light intensity of the light M'. Accordingly, it is possible to acquire information of the measurement object S on which the terahertz wave T acts.

Examples

Figure 6B:
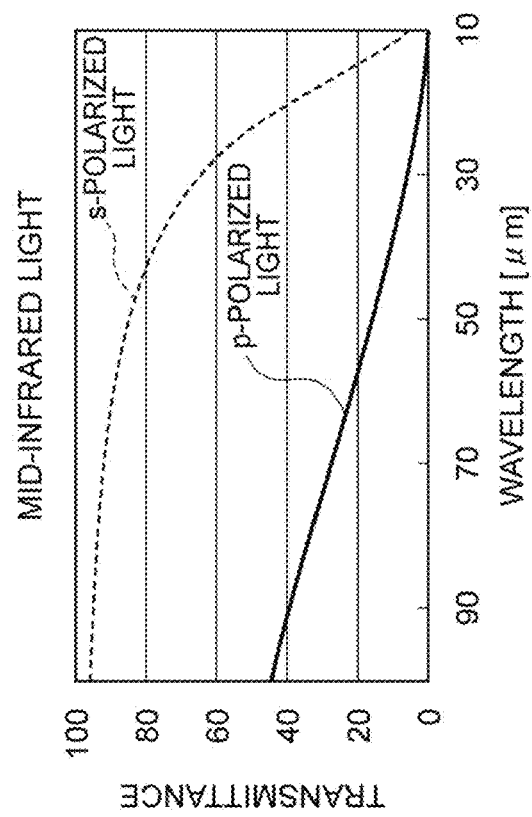
FIG. 6B is a graph showing the transmittance calculation result at the interface of the optical element according to Example 1.
Figure 6A:
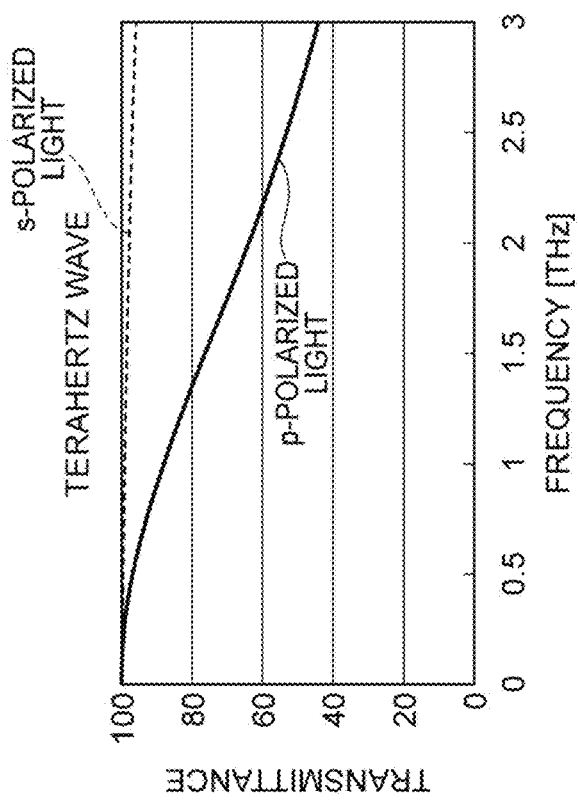
FIG. 6A is a graph showing a transmittance calculation result at an interface of an optical element according to Example 1.

FIGS. 6A and 6B are graphs showing a transmittance calculation result at an interface of an optical element according to Example 1. In Example 1, the transmittance of the terahertz wave and the mid-infrared light at the interface was calculated when the main body was formed by high resistance silicon (refractive index of 3.42), the medium disposed in the gap was air (refractive index of 1), and the gap width was 1.5 μm. The inclination angle of the gap with respect to the incident region was 45°. In the calculation, the absorption of the light inside the main body and the reflection loss at the interface are not considered.

FIG. 6A is a graph showing a transmittance of the terahertz wave. As shown in the same drawing, for p-polarized light, the transmittance tends to decrease as the frequency increases. The transmittance of the p-polarized light at a frequency of 3 THz is about 45%. Meanwhile, for s-polarized light, a decrease in transmittance is little even when the frequency increases. The transmittance of the s-polarized light at 3 THz is 90% or more.

FIG. 6B is a graph showing a transmittance of mid-infrared light. As shown in the same drawing, for any one of the p-polarized light and the s-polarized light, the transmittance tends to decrease as the wavelength decreases, but the transmittances of all of the p-polarized light and the s-polarized light at the wavelength of 10 μm are less than 10%. That is, it is understood that the reflectances of the P-polarized light and the s-polarized light at the wavelength of 10 μm are 90% or more and the terahertz wave and the mid-infrared light can be multiplexed/demultiplexed with high efficiency.

Figure 7B:
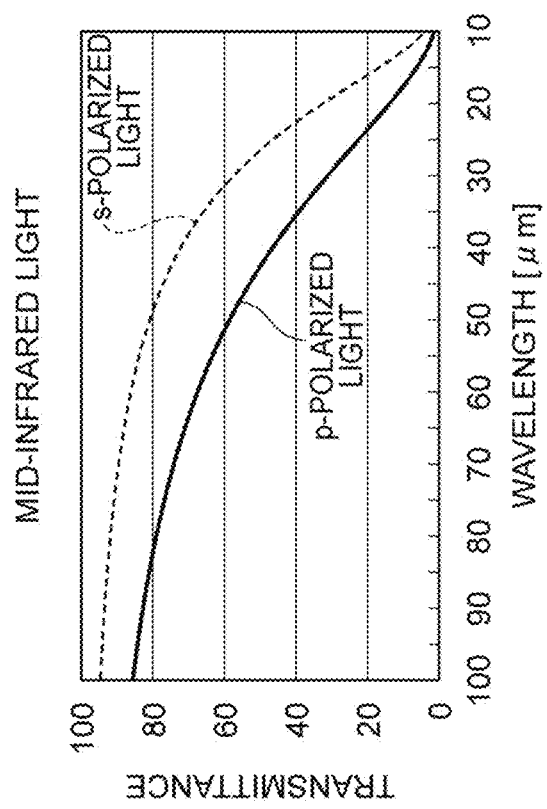
FIG. 7B is a graph showing the transmittance calculation result at the interface of the optical element according to Example 2.
Figure 7A:
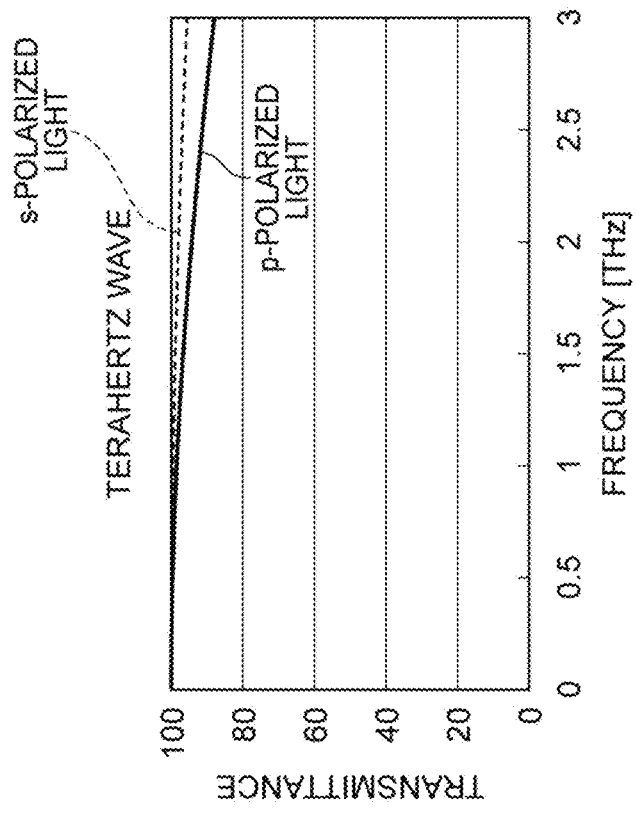
FIG. 7A is a graph showing a transmittance calculation result at an interface of an optical element according to Example 2.

FIGS. 7A and 7B are graphs showing a transmittance calculation result at an interface of an optical element according to Example 2. In Example 2, the transmittance of the terahertz wave and the mid-infrared light at the interface was calculated when the main body was formed by high resistance silicon (refractive index of 3.42), the medium disposed in the gap was paraxylylene (refractive index of 1.62), and the gap width was 2 μm. The inclination angle of the gap with respect to the incident region was 45°. In the calculation, the absorption of the light inside the main body and the reflection loss at the interface are not considered.

FIG. 7A is a graph showing a transmittance of the terahertz wave. As shown in the same drawing, for any one of the p-polarized light and the s-polarized light, the transmittance tends to decrease as the frequency increases, but the transmittances of all of the p-polarized light and the s-polarized light at the frequency of 3 THz are 90% or more. FIG. 7B is a graph showing a transmittance of the mid-infrared light. As shown in the same drawing, for any one of the p-polarized light and the s-polarized light, the transmittance tends to decrease as the wavelength decreases. The transmittances of all of the p-polarized light and the s-polarized light at the wavelength of 10 μm are less than 10%. That is, it is understood that the reflectances of the p-polarized light and the s-polarized light at the wavelength of 10 μm are 90% or more and the terahertz wave and the mid-infrared light can be multiplexed/demultiplexed with high efficiency.

Furthermore, comparing Example 1 and Example 2, the transmittance of the p-polarized light in Example 2 is remarkably larger than that of Example 1 for any one of the terahertz wave and the mid-infrared light. Thus, it is preferable to increase the refractive index of the medium disposed in the gap (close to the refractive index of the main body) when securing the demultiplexing/multiplexing efficiency of both of the p-polarized light and the s-polarized light.

Figure 8B:
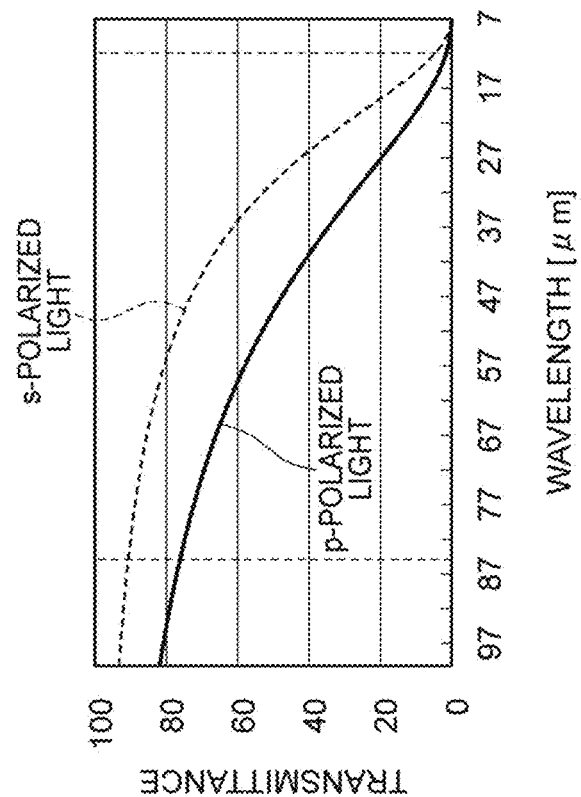
FIG. 8B is a graph showing an example of the wavelength dependence of the transmittance at the interface of the optical element.
Figure 8A:
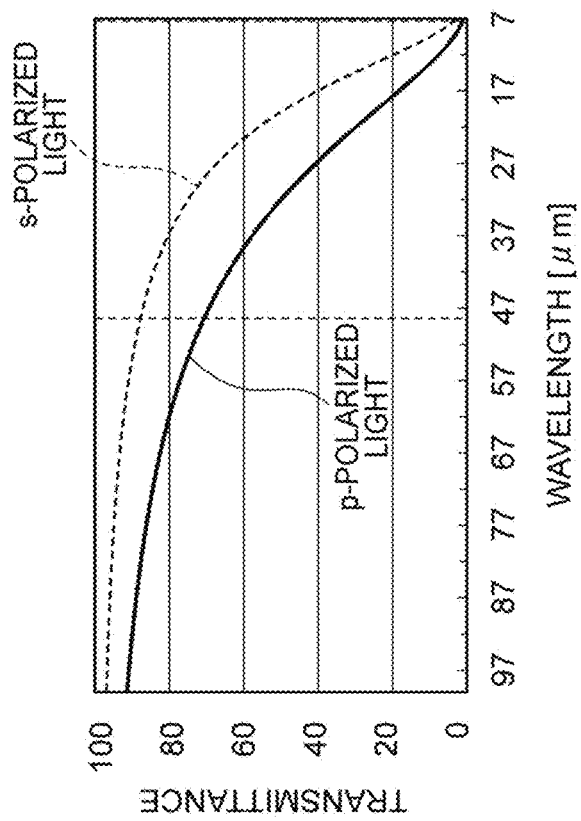
FIG. 8A is a graph showing an example of wavelength dependence of a transmittance at the interface of the optical element.

FIGS. 8A and 8B are graphs showing an example of wavelength dependence of the transmittance at the interface of the optical element. In this example, the wavelength dependence of the transmittance is calculated when the medium disposed in the gap is paraxylylene and the gap width is changed similarly to Example 2. FIG. 8A is a result when the gap width is 1.5 μm. As shown in the same drawing, the transmittances of all of the p-polarized light and the s-polarized light at the wavelength of 7 μm (corresponding to the mid-infrared light) are less than 10%. In contrast, the transmittance of the s-polarized light at the wavelength longer than the wavelength of 49 μm (corresponding to the terahertz wave of about 6 THz) is 90% or more.

FIG. 8B is a result when the gap width is 2.3 μm. As shown in the same drawing, the transmittances of all of the p-polarized light and the s-polarized light at the wavelength of 12 μm (corresponding to the mid-infrared light) are less than 10%. In contrast, the transmittance of the s-polarized light at the wavelength longer than the wavelength of 84 μm (corresponding to the terahertz wave of about 3.5 THz) is 90%. Form these results, when the wavelength of the second light incident to the optical element is seven times or more the wavelength of the first light, it is understood that the demultiplexing/multiplexing can be realized with high efficiency of 90% or more.

Figure 9:
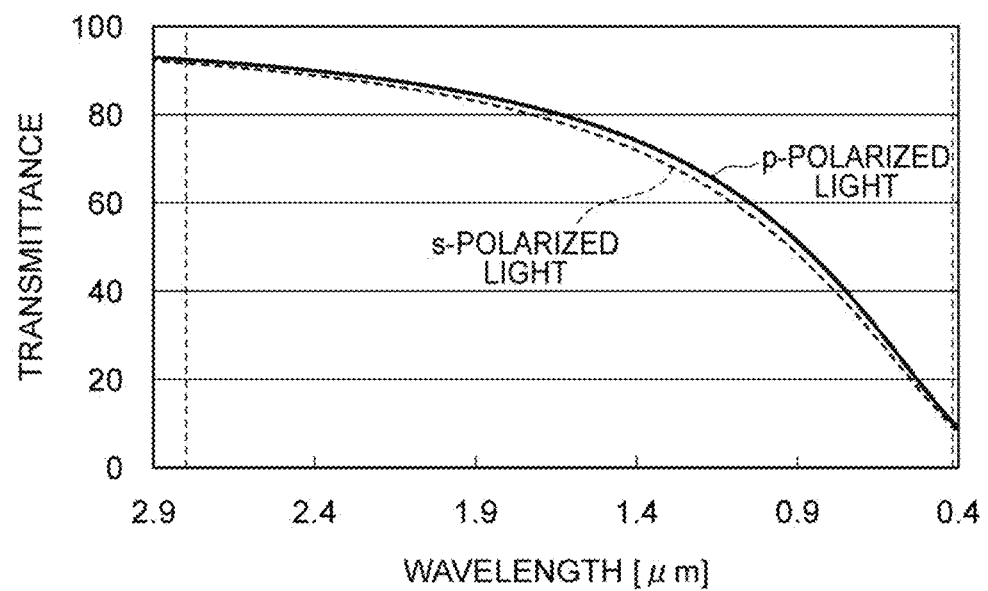
FIG. 9 is a graph showing another example of the wavelength dependence of the transmittance at the interface of the optical element.

FIG. 9 is a graph showing another example of the wavelength dependence of the transmittance at the interface of the optical element. In this example, the wavelength dependence for the visible light and the infrared light is calculated. Here, the main body was formed by glass or transparent resin (refractive index of 1.7), the medium disposed in the gap was air (refractive index of 1), and the gap width was 0.1 µm. As shown in FIG. 9, the transmittances of all of the p-polarized light and the s-polarized light at the wavelength of 0.4 µm (corresponding to the visible light) are less than 10%. In contrast, the transmittances of the p-polarized light and the s-polarized light at the wavelength longer than the wavelength of 2.8 µm (corresponding to the infrared light) are 90% or more. Also from these results, it is understood that the demultiplexing/multiplexing can be realized with high efficiency of 90% or more when the wavelength of the second light incident to the optical element is seven times or more the wavelength of the first light.

In a case in which the first light and the second light have a plurality of wavelengths or a constant wavelength band, it is possible to realize the demultiplexing/multiplexing with high efficiency of 90% or more when the shortest wavelength of the wavelength band of the second light is seven times or more the long wavelength of the wavelength band of the first light.

Modified Examples

Figure 10:
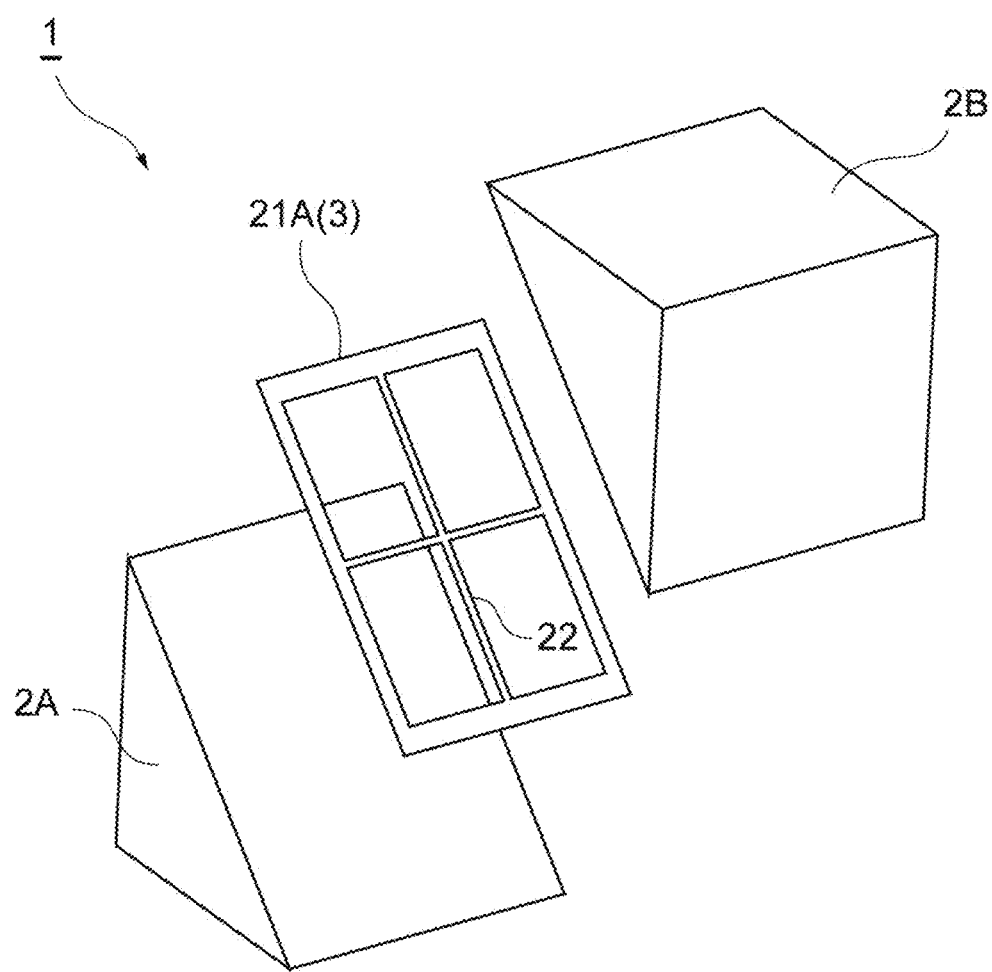
FIG. 10 is a schematic perspective view illustrating a modified example of a spacer.

The optical element 1 can be modified into various forms. FIG. 10 is a schematic perspective view illustrating a modified example of the spacer. In the example illustrated in the drawings, a frame member 21A separated from the first portion 2A and the second portion 2B is used as the spacer 3 instead of the convex portion (see FIGS. 1, 4A, and 4B). The frame member 21A is formed of, for example, metal and is formed in a rectangular shape in accordance with the shape of the inclined surfaces of the first portion 2A and the second portion 2B. As a material forming the frame member 21A, for example, gold, silver, platinum, chromium, stainless steel, aluminum, and the like are exemplified. The frame member 21A includes a cross-shaped support piece 22A that connects the midpoints of two sides facing each other. By the support piece 22A, the bending of the frame member 21A can be suppressed and the desired gap width W can be more reliably maintained.

When the frame member 21A is provided with the support piece 22A, there is a case in which the support piece 22A overlaps the optical path of the second light L2. However, when the width of the support piece 22A is set to about 1/10 or less of the wavelength of the second light L2, the influence on the transparency of the second light L2 can be suppressed. For example, when the second light L2 is the terahertz wave of 1 THz, the width of the support piece 22A may be 30 µm or less. Meanwhile, the width of the support piece 22A cannot be ignored for the first light L1 having a wavelength shorter than that of the second light L2, but in the optical element 1, the reflection of a part of the first light L1 to be totally reflected by the interface R is merely replaced with the reflection by the support piece 22A. Thus, the support piece 22A in the optical element 1 substantially does not influence the demultiplexing/multiplexing of the first light L1.

Figure 11A:
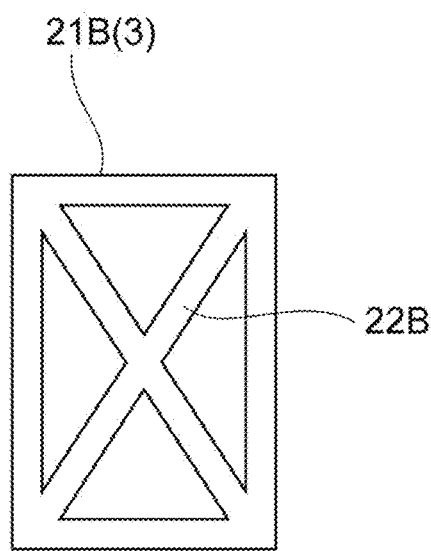
FIG. 11A is a diagram illustrating another modified example of the spacer illustrated in FIG. 10.
Figure 11B:
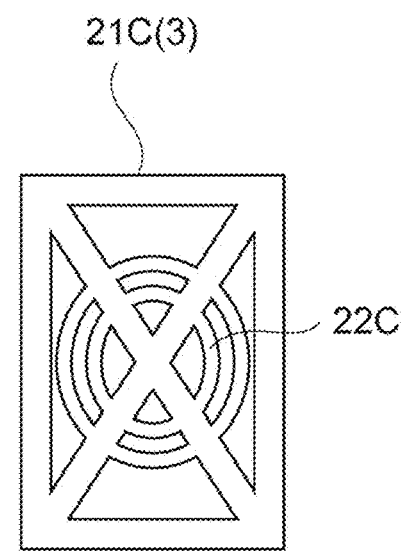
FIG. 11B is a diagram illustrating another modified example of the spacer illustrated in FIG. 10.

The configuration of the frame member can be modified into various forms. For example, as in a frame member 21B illustrated in FIG. 11A, a configuration provided with a cross-shaped support piece 22B connecting diagonals may be provided. Further, as in a frame member 21C illustrated in FIG. 11B, a configuration provided with a support piece 22C obtained by combining the cross-shaped sides connecting diagonals and the concentric sides may be provided. Even when such frame members 21B and 21C are used, the bending of the frame member 21 can be suppressed by the support pieces 22B and 22C and the desired gap width W can be more reliably maintained.

Figure 12A:
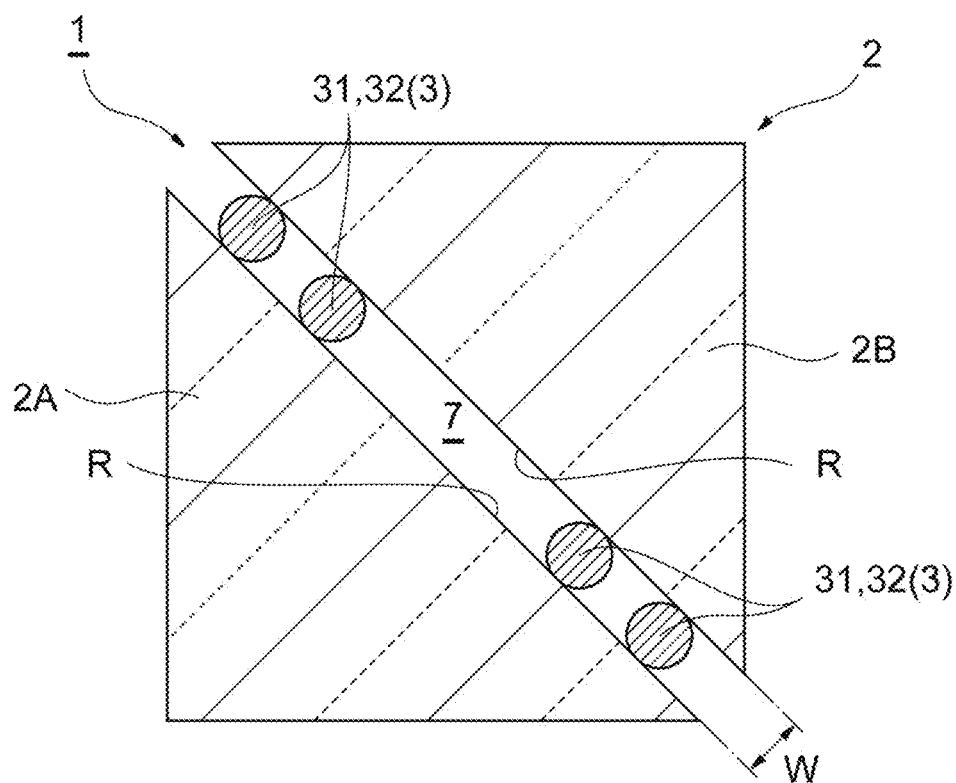
FIG. 12A is a schematic cross-sectional view illustrating another modified example of the spacer.
Figure 12B:
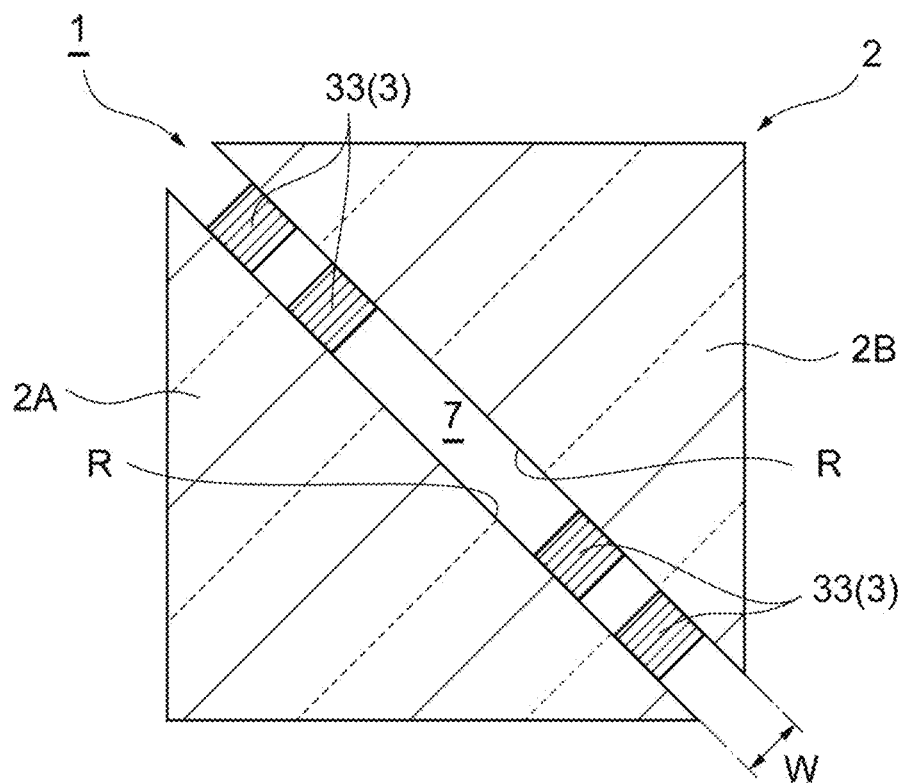
FIG. 12B is a schematic cross-sectional view illustrating another modified example of the spacer.

The spacer 3 may be formed by at least one of a fiber 31, a particle 32, and a columnar member 33 sandwiched by the first portion 2A and the second portion 2B as illustrated in FIGS. 12A and 12B. When the fiber 31 or the particle 32 is used, the gap width W can be appropriately maintained by making the maximum value of the diameter of the fiber 31 or the particle 32 to coincide with the design value of the gap width W as illustrated in FIG. 12A. The spacer 3 may be obtained by the combination of the fiber 31 and the particle 32. As the materials of the fiber 31 and the particle 32, for example, cycloolefin polymer, cellulose, polyamide, acrylic, polyester, polyethylene, polypropylene, and tetratetrafluoroethylene are exemplified. In accordance with the wavelength of the second light L2, glass, silicon, and aluminum oxide can also be used. The fiber 31 and the particle 32 can be formed by, for example, spraying to the inclined surface of the first portion 2A and the inclined surface of the second portion 2B. An electrostatic gun may be used to prevent the aggregation of the fibers 31 and the particles 32 during spraying.

When the columnar member 33 is used, the gap width W can be appropriately maintained by making the height of the columnar member 33 to coincide with the design value of the gap width W as illustrated in FIG. 12B. As the material of the columnar member 33, for example, a photoresist can be used. The columnar member 33 can be formed by applying a spacer material to the inclined surface of the first portion 2A and the inclined surface of the second portion 2B using, for example, a spin coating method and then performing pre-baking, exposure, and development.

Figure 13:
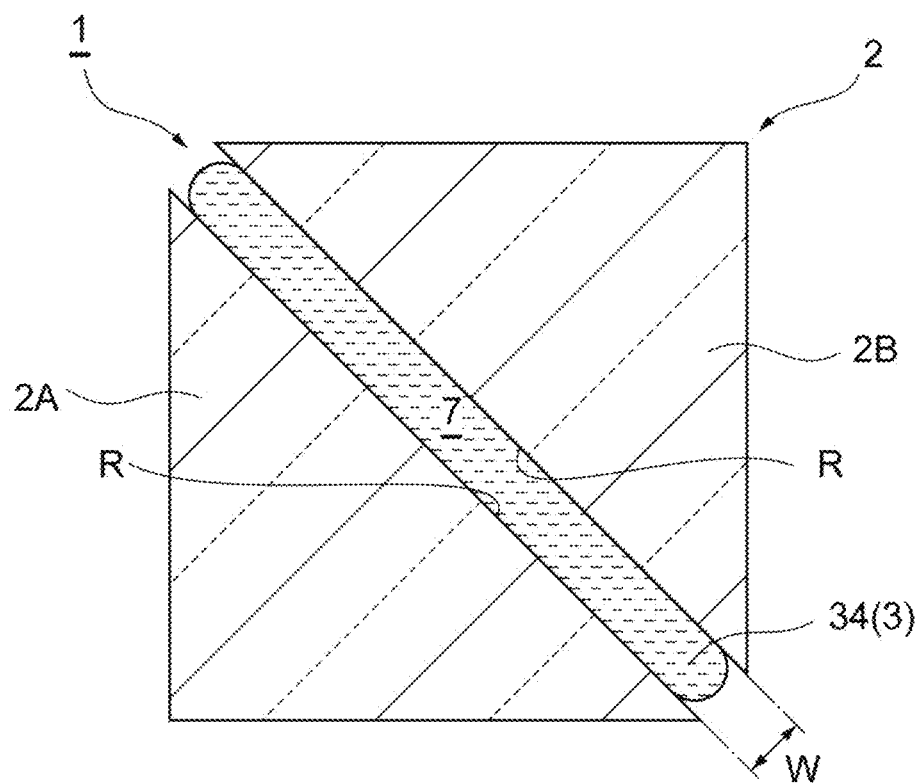
FIG. 13 is a schematic cross-sectional view illustrating still another modified example of the spacer.

The spacer 3 may be formed by, as illustrated in FIG. 13, a liquid 34. As the liquid 34, for example, water, ethanol, acetone, fluorine-based inert liquid, and the like are exemplified. In this case, the first portion 2A and the second portion 2B are coupled to each other through the liquid 34 and the liquid 34 becomes a medium disposed in the gap 7. For the coupling of the first portion 2A and the second portion 2B, for example, the necessary volume of the liquid 34 is set on the basis of the area of the gap 7 and the design value of the gap width W. Next, the liquid 34 is dropped onto the inclined surface of the first portion 2A or the inclined surface of the second portion 2B and the inclined surface of the second portion 2B is pressed against the inclined surface of the first portion 2A. Accordingly, the first portion 2A and the second portion 2B are coupled to each other with sufficient adhesion due to the action of the surface tension or the like of the liquid 34.

In the example illustrated in FIGS. 1 and 3, the inclination angle of the gap 7 with respect to the incident region 5 was 45°, but the inclination angle can be set arbitrarily. Further, in the example illustrated in FIGS. 1 and 3, the incident angles of the first light L1 and the second light with respect to the incident region 5 are 90°, but the incident angles may be arbitrary angles. In this case, it is possible to adjust the demultiplexing/multiplexing efficiency by the optical element 1.

Figure 14:
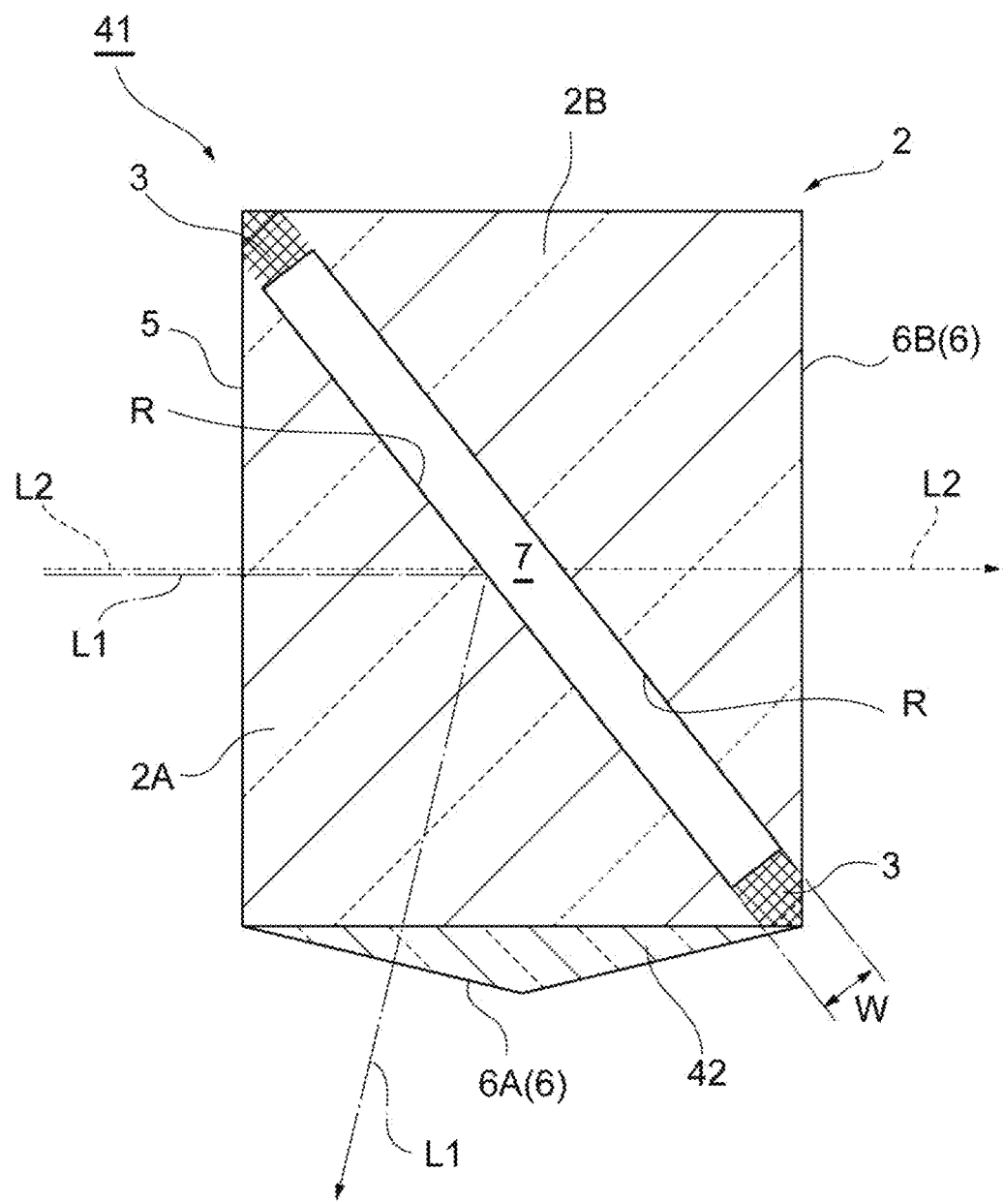
FIG. 14 is a schematic cross-sectional view illustrating a modified example of a main body.

Further, the angle of the side surfaces constituting the incident region 5 and the emission region 6 in the main body 2 may be non-orthogonal so that the first light L1 and the second light L2 after demultiplexing or the first light L1 and the second light L2 before multiplexing are not orthogonal to each other. When such a configuration is employed, for example, as in an optical element 41 illustrated in FIG. 14, the main body 2 may be provided with a coupler 42 which adjusts the incident angles or the emission angles of the first light L1 and the second light L2. The coupler 42 is formed of, for example, the same material as that of the main body 2. In the example of FIG. 14, the triangular prism-shaped coupler 42 is provided in the side surface which becomes the emission region of the first light L1 in the first portion 2A. Accordingly, the inclined surface of the coupler 42 becomes the first emission region 6A and the first light L1 and the second light L2 after demultiplexing are not orthogonal to each other. The coupler 42 may be attachable to or detachable from the main body 2.

Figure 15:
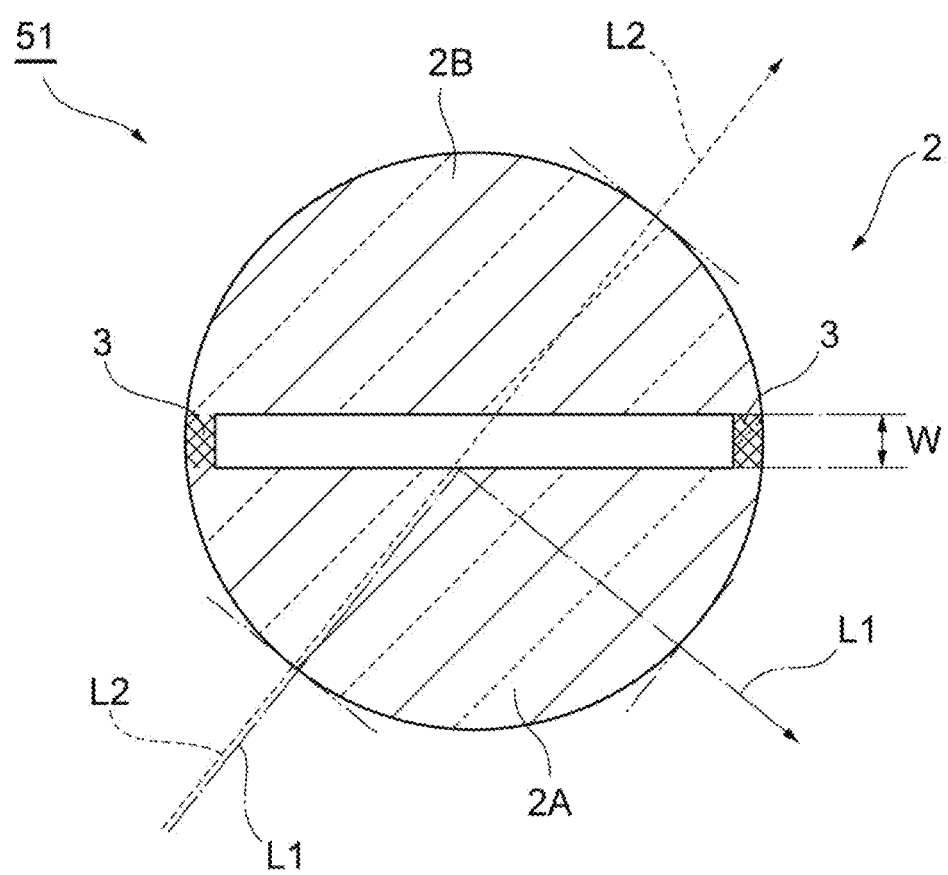
FIG. 15 is a schematic cross-sectional view illustrating another modified example of the main body.

As in an optical element 51 illustrated in FIG. 15, the main body 2 may have a spherical shape. In this case, when the first portion 2A and the second portion 2B respectively have semi-spherical shapes and are coupled to each other, the main body 2 having a spherical shape can be obtained. When the main body 2 has a spherical shape, it is possible to adjust the demultiplexing/multiplexing efficiency of the optical element 1 in accordance with the incident positions of the first light L1 and the second light L2. Further, the incident angles and the emission angles of the first light L1 and the second light L2 can be made orthogonal to the side surface of the main body 2 (the tangent plane at the contact point between the optical axis and the side surface of the main body 2) all the time regardless of the incident positions of the first light L1 and the second light L2.

What is claimed is:

1. An optical element comprising:
   a main body which is formed of a medium capable of transmitting first light and second light having a wavelength longer than that of the first light, and the second light is a terahertz light,
   wherein the main body includes an incident region into which the first light and the second light are incident,
   wherein a gap which is inclined with respect to the incident region and in which a medium having a refractive index with respect to the first light and the second light lower than that of the main body is disposed is provided inside the main body,
   wherein a gap width from an interface bordering the main body and the gap is larger than a penetration length of an evanescent wave of the first light at the interface and is smaller than a penetration length of an evanescent wave of the second light at the interface, and
   wherein air is disposed as a medium in the gap.

2. The optical element according to claim 1,
   wherein the main body includes a first portion including an incident region into which the first light and the second light are coaxially incident and an emission region which emits the first light reflected by the interface and a second portion including an emission region which emits the second light passing through the gap.

3. The optical element according to claim 2,
   wherein the main body includes a spacer which forms the gap.

4. The optical element according to claim 3,
   wherein the spacer is formed by at least one of a fiber, a particle, and a columnar member sandwiched by the first portion and the second portion.

5. The optical element according to claim 3,
   wherein the spacer is formed by a liquid, and
   wherein the first portion and the second portion are coupled to each other through the liquid.

6. The optical element according to claim 3,
   wherein the spacer is formed by a convex portion which is provided in at least one of the first portion and the second portion.

7. The optical element according to claim 3,
   wherein the spacer is formed by a frame member that is sandwiched by the first portion and the second portion.

8. The optical element according to claim 1,
   wherein the main body includes a first portion including an incident region into which the second light is incident and a second portion including an incident region into which the first light is incident and an emission region which coaxially emits the first light reflected by the interface and the second light passing through the gap.

9. The optical element according to claim 8,
   wherein the main body includes a spacer which forms the gap.

10. The optical element according to claim 9,
    wherein the spacer is formed by a convex portion which is provided in at least one of the first portion and the second portion.

11. The optical element according to claim 9,
    wherein the spacer is formed by a frame member that is sandwiched by the first portion and the second portion.

12. The optical element according to claim 9,
    wherein the spacer is formed by at least one of a fiber, a particle, and a columnar member sandwiched by the first portion and the second portion.

13. The optical element according to claim 9,
    wherein the spacer is formed by a liquid, and
    wherein the first portion and the second portion are coupled to each other through the liquid.

14. The optical element according to claim 1,
    wherein the main body has a spherical shape.

15. The optical element according to claim 1,
    wherein the main body further includes a coupler which adjusts incident angles or emission angles of the first light and the second light.

16. The optical element according to claim 1,
    wherein a wavelength of the second light is seven times or more a wavelength of the first light.

* * * * *